(12) United States Patent
Yamakami et al.

(10) Patent No.: US 8,720,519 B2
(45) Date of Patent: May 13, 2014

(54) ELECTRONIC PACKAGING APPARATUS AND ELECTRONIC PACKAGING METHOD

(75) Inventors: Takatoyo Yamakami, Kawasaki (JP); Hidehiko Kira, Kawasaki (JP); Takashi Kubota, Kawasaki (JP); Kiyoshi Oi, Nagano (JP); Kiyoaki Iida, Nagano (JP); Takashi Kurihara, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 13/117,584

(22) Filed: May 27, 2011

(65) Prior Publication Data

US 2012/0043005 A1 Feb. 23, 2012

(30) Foreign Application Priority Data

Aug. 20, 2010 (JP) ................. 2010-185610

(51) Int. Cl.
    *B32B 37/02* (2006.01)
(52) U.S. Cl.
    USPC ........................... 156/538; 156/60
(58) Field of Classification Search
    USPC .................................. 156/60, 538
    See application file for complete search history.

(56) References Cited

U.S. PATENT DOCUMENTS

| | | |
|---|---|---|
| 6,664,643 B2 | 12/2003 | Emoto |
| 8,198,728 B2 | 6/2012 | Nishimura |
| 2008/0188058 A1 | 8/2008 | Nishimura et al. |

FOREIGN PATENT DOCUMENTS

| | | | |
|---|---|---|---|
| JP | 11-067842 | A | 3/1999 |
| JP | 2001-320014 | A | 11/2001 |
| JP | 2001-326251 | A | 11/2001 |
| JP | 2003-007771 | | 1/2003 |
| JP | 2004259921 | A * | 9/2004 |
| JP | 2006-066767 | | 3/2006 |
| JP | 2007-197314 | A | 8/2007 |
| JP | 2007-294989 | A | 11/2007 |
| JP | 2008072015 | A * | 3/2008 |
| JP | 2009-054747 | A | 3/2009 |
| WO | WO 2007/043152 | A1 | 4/2007 |

OTHER PUBLICATIONS

Taiwanese Office Action (with English language translation) issued on Aug. 6, 2013, for corresponding Taiwanese Patent Application No. 100119034.
Notice of Rejection dated Dec. 3, 2013 corresponding to Japanese Patent Application No. 2010-185610 and English translation thereof.

\* cited by examiner

*Primary Examiner* — Daniel McNally
*Assistant Examiner* — Margaret Squalls
(74) *Attorney, Agent, or Firm* — Squire Sanders (US) LLP

(57) ABSTRACT

A bonding tool holds a lower chip against a release tape held by a suction force. The bonding tool has an electronic-component suction opening against which the lower chip is held and, surrounding the electronic-component suction opening, a trench that accommodates the release tape. The lower chip is heated, by being pressed against an underfill material and, thus, an area on which an upper chip is mounted is formed in such a manner that the underfill material protrudes out from the lower chip. During the heating, because an expanded part of the release tape, expanded due to heat, is inserted into the trench, no folded line is formed on the upper surface of the underfill material.

7 Claims, 12 Drawing Sheets

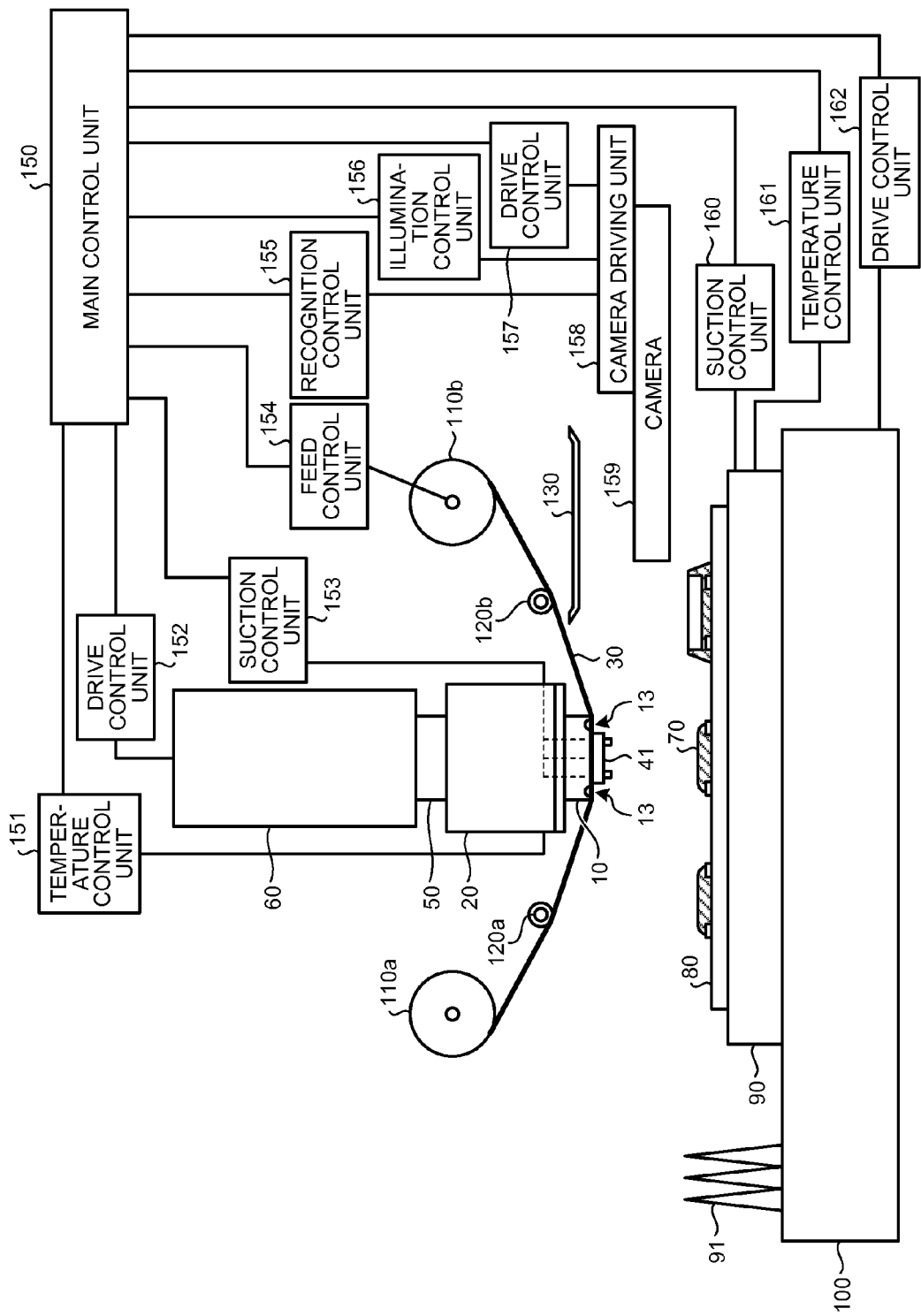

FEED RELEASE TAPE

FORM OPENINGS ON RELEASE TAPE USING NEEDLES EXTENDING FROM SOMETHING LIKE PIN-HOLDER

HOLD CHIP BY SUCTION FORCE

MOUNT CHIP ONTO SUBSTRATE HARDEN UNDERFILL AT THE SAME TIME
HEAT AND PRESSURE

CHIP IS MOUNTED

USED RELEASE TAPE

USED RELEASE TAPE

USED RELEASE TAPE

PLAN VIEW OF TOOL

FEED RELEASE TAPE
HOLD RELEASE TAPE
BY SUCTION FORCE

FORM OPENINGS ON
RELEASE TAPE

HOLD CHIP BY
SUCTION FORCE

MOUNT CHIP ONTO SUBSTRATE
HARDEN UNDERFILL AT THE SAME TIME
HEAT AND PRESSURE

CHIP IS MOUNTED

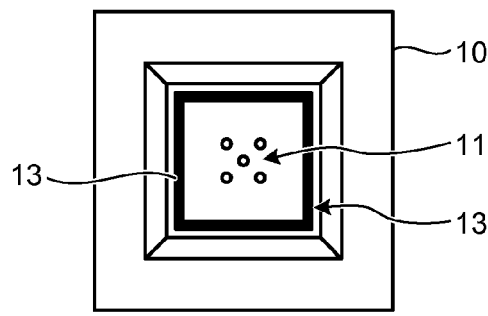
FIG.13A
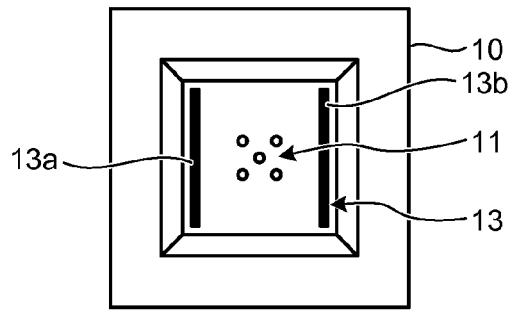
FIG.13B
FIG.13C
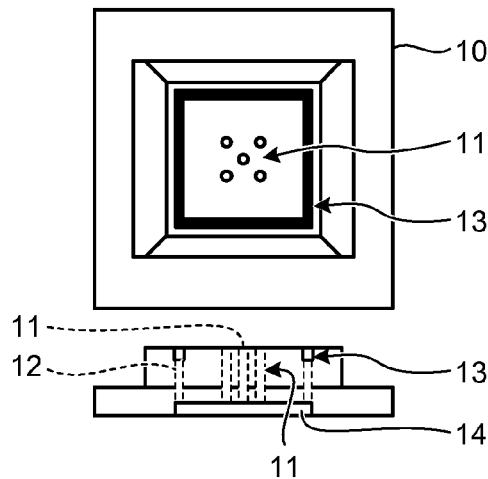
FIG.13D
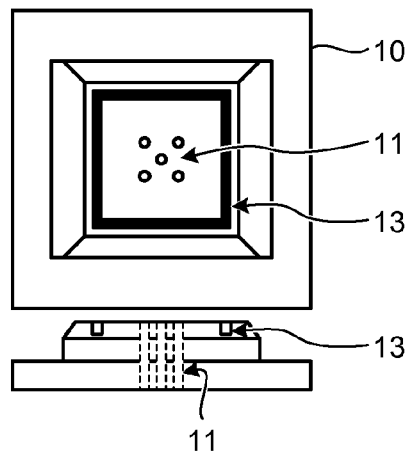

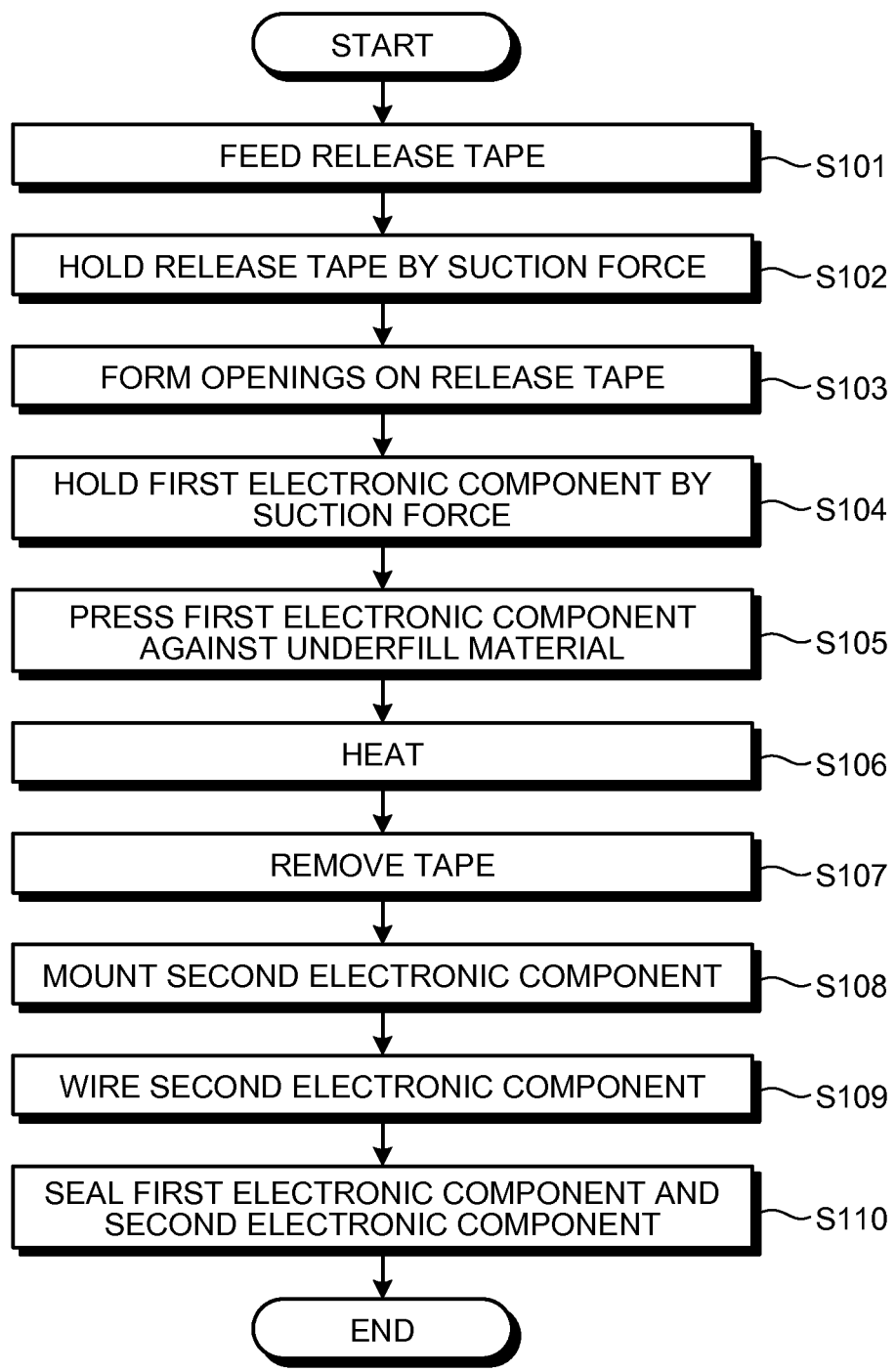

ELECTRONIC PACKAGING APPARATUS AND ELECTRONIC PACKAGING METHOD

CROSS-REFERENCE TO RELATED APPLICATION

This application is based upon and claims the benefit of priority of the prior Japanese Patent Application No. 2010-185610, filed on Aug. 20, 2010, the entire contents of which are incorporated herein by reference.

FIELD

The embodiment discussed herein is directed to an electronic packaging apparatus and an electronic packaging method.

BACKGROUND

In a conventional well-known electronic packaging technology, to mount an electronic component onto a substrate, a bonding tool having a suction opening holds an electronic component against a release tape by a suction force, presses the electronic component against an adhesive agent that is applied on the substrate, and heats the electronic component. More particularly, the bonding tool holds a release tape, which is a releasable fluorinated tape, by a suction force and then forms an opening on the fluorinated tape with a needle in such a manner that the opening is aligned with a chip suction opening of the bonding tool. The bonding tool then holds a chip by a suction force and then mounts the chip onto the substrate.

With the modern trend of slimming large-scale-integration (LSI) packages, slim electronic components (chips) and flip chips are used more and more as embedded components. In multi-chip implementations where layered electronic components are formed inside a package, in some cases, an overhang is formed, i.e., an upper chip (second electronic component) overhangs the circumference a lower chip (first electronic component).

If an overhang occurs, as the thickness of the chip decreases, issues of concern occur, such as a decrease in the performance of upper-chip wire bonding and chip breakage. To prevent the problems caused by an overhang, such as a decrease in the performance of upper-chip wire bonding and chip breakage, an approach is considered to reinforce the overhang with an adhesive agent (underfill material) that is applied to a substrate before a lower chip is mounted on the substrate by protruding the adhesive agent out from the circumference of the lower chip. According to this approach, the upper chip is mounted on an area including both the upper surface of the lower chip and a protruding part of the upper surface of the underfill material.

However, if a lower chip is mounted onto a substrate using the above conventional overhang reinforcing technology, because the release tape is expanded by heat and a folded line is formed, the folded line is transferred onto the underfill material protruding out from the circumference of the lower chip.

The fluorinated tape is not held in place: due to heat (for example, approximately 200° C. or higher) coming from the bonding tool during chip mounting, the fluorinated tape that is made of, for example, a polytetrafluoroethylene (PTEE) film is expanded and a folded line is formed between an expanded part and a non-expanded part. The folded line extends to an area where the underfill material is formed as a fillet and, therefore, the folded line is formed on the fillet.

If a folded line is transferred onto the upper surface of the underfill material on which the upper chip is mounted, there is a possibility of a decrease in the performance of the upper-chip wire bonding, a crack forming during wire-bonding, a decrease in the adhesivity of the adhesive surface on which the chip is mounted, etc. Moreover, if an excess amount of the adhesive agent is supplied accidentally because of poor control over the amount of adhesive agent supplied, an issue of concern arises in that the excess adhesive agent may contaminate adjacent components. The above problems occur regardless of the type of the underfill material (sheet or paste) and the type of the adhesive agent of the upper chip (sheet or paste). If the thickness of the upper chip is approximately 200 µm or lower, the possibility of breakage becomes high.

Even if no more chips are mounted, i.e., only one chip is mounted, when an excess amount of adhesive agent is supplied because a folded line is formed, an issue of concern arises in that the excess adhesive agent contaminates a wiring pattern.

Patent document 1: Japanese Laid-open Patent Publication No. 2003-7771

Patent document 2: Japanese Laid-open Patent Publication No. 2006-66767

SUMMARY

According to an aspect of an embodiment of the invention, an electronic packaging apparatus for mounting electronic components onto a substrate includes a bonding tool that holds a first electronic component against a release tape held by a suction force, wherein the bonding tool has a first suction opening against which the first electronic component is held and, surrounding the first suction opening, a trench that accommodates the release tape, the trench extends in an area outside an outline of an adhesive agent that is between the first electronic component and the substrate.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 3 is a schematic diagram of the configuration of the electronic packaging apparatus according to the present embodiment;

FIGS. 13A to 13D are schematic diagrams of modifications of the trench; and

FIG. 14 is a flowchart of an electronic packaging method according to the present embodiment.

DESCRIPTION OF EMBODIMENT

A preferred embodiment of the present invention will be explained with reference to accompanying drawings.

Figure 1A:
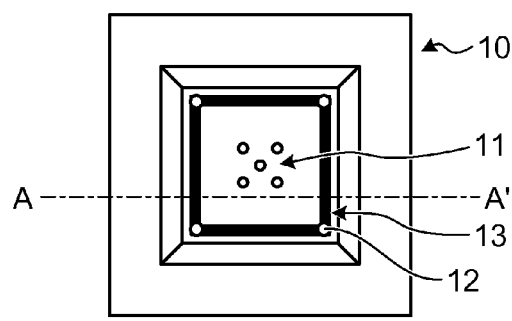
FIGS. 1A and 1B are schematic diagrams of a bonding tool of an electronic packaging apparatus according to the present embodiment.
Figure 1B:
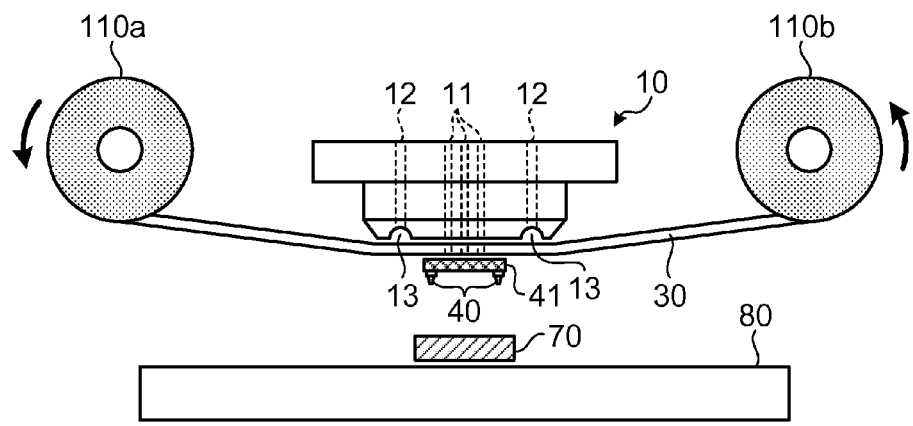

FIGS. 1A and 1B are schematic diagrams of a bonding tool of an electronic packaging apparatus according to the present embodiment. FIG. 1A is a plan view of a bonding tool 10; FIG. 1B is a cross-sectional view of the bonding tool taken along the A-A' line.

The bonding tool 10 is used to mount, during multi-chip implementation performed by an electronic packaging apparatus to overlap a second electronic component to a first electronic component, the first electronic component or a chip 41 onto a substrate 80.

The bonding tool 10 holds the chip 41 against a release tape 30 by a suction force. The bonding tool 10 has electronic-component suction openings 11 and a trench 13 that surrounds the electronic-component suction openings 11: the electronic-component suction openings 11 are used to hold the chip 41 and the trench 13 accommodates the release tape. More particularly, the trench 13 accommodates an expanded part of the release tape 30, expanded due to heat.

The trench 13 extends in an area outside the outline of an underfill material 70 that is an adhesive agent between the chip 41 and the substrate 80. The trench 13 extends in accordance with the shape of an edge surface of the bonding tool 10 to surround the electronic-component suction openings 11. The trench 13 extends in an area outside a mounting position of a later-described second electronic component or a chip 42. Tape suction openings 12 are formed inside the trench 13 to hold the release tape 30 by a suction force.

The release tape 30 is fed from a feed-out reel 110a to a feed-in reel 110b. The release tape 30 has openings at positions facing the electronic-component suction openings. It is allowable to either adjust a feeding amount of the release tape 30 so that the openings formed at arbitrary positions on the release tape 30 are aligned with positions facing the electronic-component suction openings 11 or form, after the release tape 30 is fed out, the openings at positions aligned with the electronic-component suction openings 11.

The bonding tool 10 fixes the release tape 30 by an exhaust air from the tape suction openings 12. The bonding tool 10 holds the chip 41 against the release tape 30 by an exhaust air from the electronic-component suction openings 11.

The bonding tool 10 presses the chip 41 with bumps 40 formed thereon against the underfill material 70 that is formed on the substrate 80 and heats the chip 41, thereby mounting the chip 41 onto the substrate 80.

Figure 2:
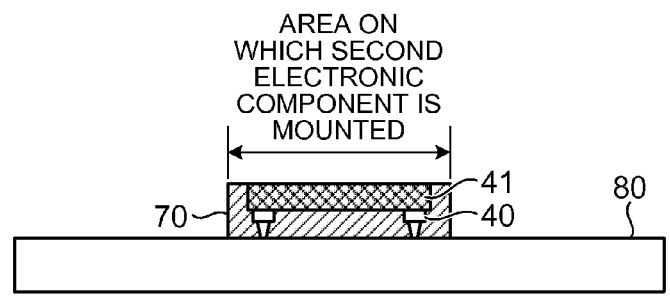
FIG. 2 is a schematic diagram of a substrate with a chip mounted thereon.

FIG. 2 is a schematic diagram of the substrate 80 with the chip 41 mounted thereon. The underfill material 70 protrudes out from the circumference of the chip 41 to support the second electronic component. In other words, the second electronic component is mounted on an area including both the upper surface of the chip 41 and the protruding part of the upper surface of the underfill material 70. The side on which a chip is mounted with respect to the substrate is, herein, the upper side.

The substrate 80 can be either a main substrate, such as a motherboard, or an interposer that is sealed by molding.

FIG. 3 is a schematic diagram of the configuration of the electronic packaging apparatus according to the present embodiment. As illustrated in FIG. 3, the electronic packaging apparatus includes the bonding tool 10, a bonding head 20, a connecting section 50, a moving-up/down unit 60, a bonding stage 90, a needle member 91, a table 100, the feed-out reel 110a, the feed-in reel 110b, guide rollers 120a and 120b, and a tray 130. The electronic packaging apparatus further includes a main control unit 150, a temperature control unit 151, a drive control unit 152, a suction control unit 153, a feed control unit 154, a recognition control unit 155, an illumination control unit 156, a drive control unit 157, a camera driving unit 158, a camera 159, a suction control unit 160, a temperature control unit 161, and a drive control unit 162.

The bonding tool 10 holds the chip 41 against the release tape 30 by vacuum suction. The bonding tool 10 sucks the release tape 30 and fixes the release tape 30 by vacuum suction, then forms openings on the release tape 30 with the needle member 91, and then holds the chip 41 by vacuum suction through the openings.

The bonding head 20 is attached with the bonding tool 10. The bonding head 20 is configured to attach an appropriate bonding tool 10 in accordance with the type of the chip 41.

The release tape 30 is between the suction surface of the bonding tool 10 and the chip 41. When the chip 41 is mounted onto the substrate 80, the release tape 30 prevents the underfill material 70 being adhesive to the suction surface of the bonding tool 10.

The release tape 30 preferably has a high non-adhesivity, a high heat resistance, and a high anti-crystalline. The release tape 30 is, for example, a fluorine resin film, such as PTFE, tetrafluoroethylene-perfluoroalkyl vonyl ether copolymer (PFA), tetrafluoroethylene-hexafluorpropylene copolymer (FEP), tetrafluoroethylene-ethylene copolymer (ETFE), polyvinylidenefluoride (PVDF), polychlorotrifluoroethylene (PCTFE). Because the release tape 30 has non-adhesivity, even if, when the chip 41 is mounted, the adhesive agent 70 protrudes out and is adhesive thereto, the chip 41 is easily removed from the release tape 30 when the bonding tool 10 moves up.

The connecting section 50 connects the bonding head 20 to the moving-up/down unit 60. The connecting section 50 is moved up and down by the moving-up/down unit 60 and this movement moves the bonding head 20 up and down. The substrate 80 is applied or bonded with the underfill material 70 and the chip 41 is then mounted on the substrate 80.

The substrate 80 is placed on the upper surface of the bonding stage 90. The bonding stage 90 emits heat and the heat decreases the adhesivity of the adhesive agent 70 on the substrate 80. The bonding stage 90 is attached onto the upper surface of the table 100. By movement of the table 100, the bonding stage 90 moves in X-Y directions on the level. An appropriate bonding stage 90 is attachable depending on the type of the substrate 80.

The feed-out reel 110a has unused part of the release tape 30 winding therearound. Every end of mounting of the chip 41, the feed-in reel 110b rotates and feeds the release tape 30 from the feed-out reel 110a. With this configuration, when the chip 41 is held by the bonding tool 10 by a suction force, unused part of the release tape 30 is in contact with the suction surface of the bonding tool 10. Alternatively, it is allowable to feed the release tape 30 every time when mounting of the chip 41 is repeated a predetermined times.

The feed-in reel 110b can be configured to feed the release tape 30, a surface with which the chip 41 is in contact being inward. This decreases the amount of the underfill material 70 falling from the release tape 30 when the release tape 30 is fed into the feed-in reel 110b.

The guide roller 120a is between the bonding tool 10 and the feed-out reel 110a. The guide roller 120b is between the bonding tool 10 and the feed-in reel 110b. The guide rollers 120a and 120b are above the bonding tool 10 and below the feed-out reel 110a and the feed-in reel 110b.

The guide rollers 120a and 120b guide the release tape 30 so that the release tape 30 smoothly moves toward the bonding tool 10. Because the guide rollers 120a and 120b are above the bonding tool 10, the release tape 30 moves down to the suction surface of the bonding tool 10 and then moves up. The release tape 30 is thus in contact with the suction surface, being pressed upward. The guide rollers 120a and 120b guide the release tape 30 in such a manner that they are in contact with an opposite surface of the release tape 30 to the surface with which the chip 41 is in contact. With this configuration, excess underfill material on the release tape 30 cannot be inserted into between any of the guide rollers 120a and 120b and the release tape 30 and cannot be attached to the guide rollers 120a and 120b, which prevents misguide by the release tape 30. The feed-out reel 110a, the feed-in reel 110b, and the guide rollers 120a and 120b move up and down in accordance with movement of the bonding tool 10. Alternatively, it is allowable to configure to fix the feed-out reel 110a, the feed-in reel 110b, and the guide rollers 120a and 120b and independently move the bonding tool 10 up and down.

The tray 130 is set between the bonding tool 10 and the feed-in reel 110b, above the camera 159, and below the release tape 30. The tray 130 receives the underfill material 70 falling down from the used release tape 30. With this configuration, the underfill material cannot fall down onto either the substrate 80 or the camera 159.

The main control unit 150 controls over the operation of each control unit. The temperature control unit 151 controls the temperature of the bonding head 20. The temperature control unit 151 controls the temperature of the bonding tool 10 via the bonding head 20 and heats the chip 41. The drive control unit 152 controls up-and-down movement of the moving-up/down unit 60. The suction control unit 153 causes the bonding tool 10 to hold the release tape 30 and the chip 41 by vacuum suction. After the release tape 30 is held by a suction force, the suction control unit 153 causes the bonding tool 10 to hold the chip 41 by a suction force. After that, the bonding tool 10 moves down, mounts the chip 41 onto the substrate 80, and releases the chip 41. After that, the bonding tool 10 moves up and then releases the release tape 30.

The feed control unit 154 controls the feeding amount of the release tape 30 by adjusting rotation of the feed-in reel 110b. The feed control unit 154 controls movement of the release tape 30 after the bonding tool 10 releases the chip 41.

The recognition control unit 155 processes an image taken by the camera 159, thereby identifying positions of the chip 41 and the substrate 80. The illumination control unit 156 controls the intensity of an illumination of the camera 159. The drive control unit 157 moves the camera driving unit 158 in the X-Y directions on the level so that the camera 159 observes the electronic component 41 and the substrate 80.

The suction control unit 160 controls vacuum suction exerted on the substrate 80 that is mounted on the bonding stage 90. The substrate 80 is fixed on the bonding stage 90 by vacuum suction that is under control of the suction control unit 160. The temperature control unit 161 controls heat generated by the bonding stage 90 and decreases the adhesivity of the adhesive agent 70 on the substrate 80. The drive control unit 162 moves the bonding stage 90 mounted on the table 100 in the X-Y directions on the level so that the needle member 91 or the chip 41 moves to a position right below the bonding tool 10.

Figure 4A:
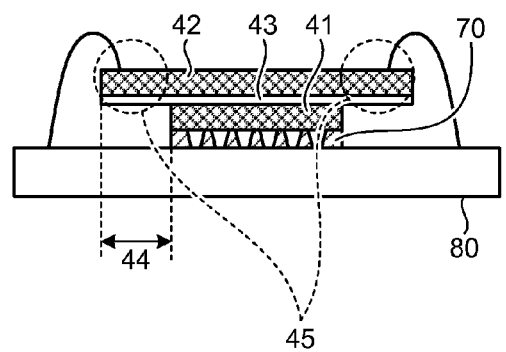
FIGS. 4A and 4B are schematic diagrams of the substrate with a multi-chip mounted thereon.
Figure 4B:
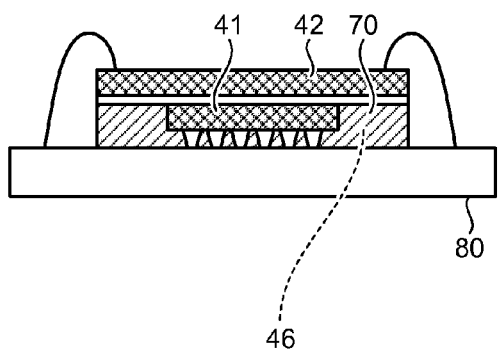

FIGS. 4A and 4B are schematic diagrams of the substrate with a multi-chip mounted thereon. As illustrated in FIG. 4A, the lower chip 41 is formed on the substrate 80 via the underfill material 70 as a flip chip and then the upper chip 42 is adhesive to the upper surface of the chip 41 with an adhesive agent 43. After that, the chip 42 is wired by wire bonding. If, in a multi-chip with two chips or the chips 41 and 42 formed layered, the area on which the upper chip 42 is mounted is larger than the area on which the lower chip 41 is mounted, an overhang 44 is formed and the chip 42 overhangs the chip 41. The area of the overhang depends on the difference between the area on which the chip 42 is mounted and the area on which the chip 41 is mounted.

Because, if an overhang is formed, when the chip 42 is wired by wire bonding, the bonding performance may decrease and the chip may break down (45), as illustrated in FIG. 4B, the overhang is reinforced with the underfill material 70 of the chip 41 (46), by supporting the lower surface of the overhang.

Figure 5A:
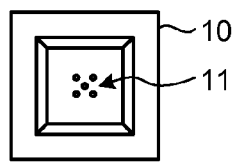
FIGS. 5A to 5F are schematic diagrams that illustrate how a folded line is formed on an underfill material.
Figure 5B:
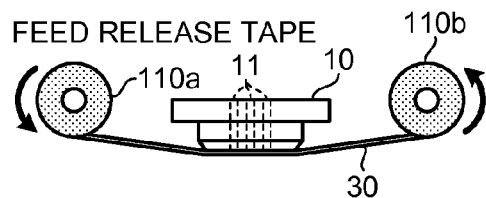
Figure 5C:
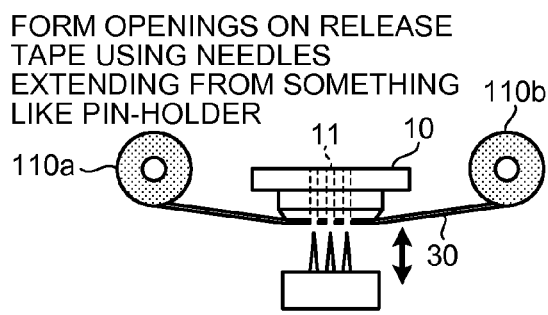
Figure 5D:
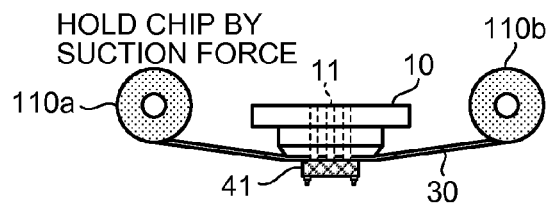
Figure 5E:
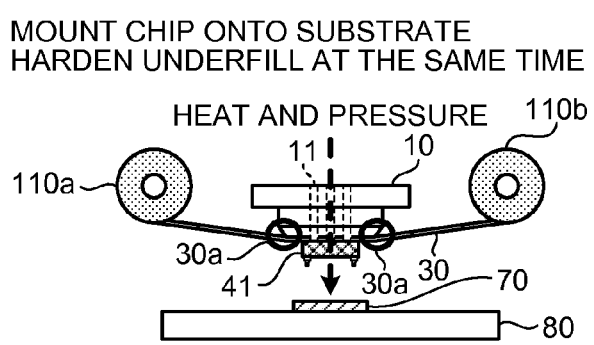
Figure 5F:
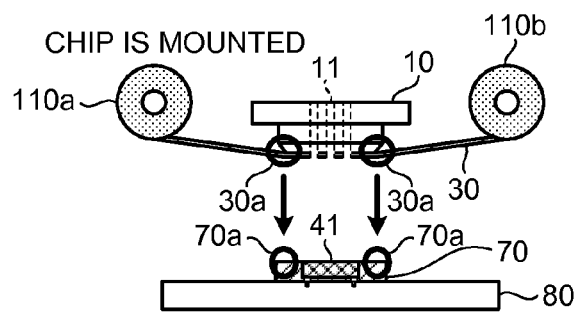

FIGS. 5A to 5F are schematic diagrams that illustrate how a folded line is formed on the underfill material 70. As illustrated in FIG. 5A, if the bonding tool 10 has the chip suction openings 11 but does not have any tape suction opening or any tape suction trench, when the chip 41 is mounted as a flip chip, folded lines 70a are formed on the underfill material 70. The chip 41 is mounted as a flip chip as the following five steps:

(5B) Feed the release tape.
(5C) Form openings on the release tape using needles extending from something like a pin-holder.
(5D) Hold the chip 41 by a suction force.
(5E) Apply heat and pressure to the chip 41 and mount the chip 41 onto the substrate.
(5F) The chip is mounted.

When the heat and pressure is applied at 5E, the underfill material 70 is hardened at the same time and the release tape is expanded by the heat and folded lines 30a are formed thereon. Because the folded lines 30a are transferred onto the underfill material 70, the folded lines 70a remain on the underfill material 70.

Figure 6A:
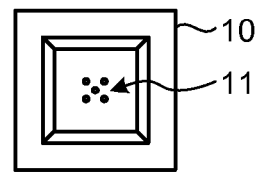
FIGS. 6A to 6C are first schematic diagrams of traces remaining on the used tape and folded lines formed on the product.
Figure 6B:
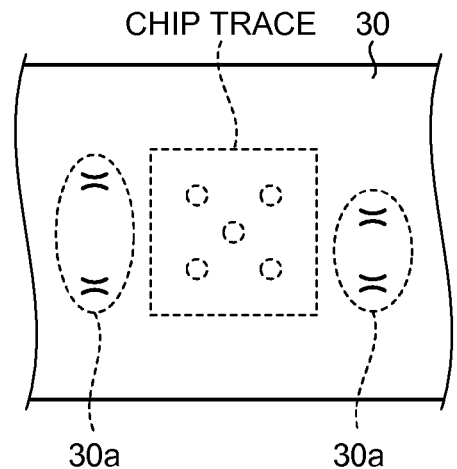
Figure 6C:
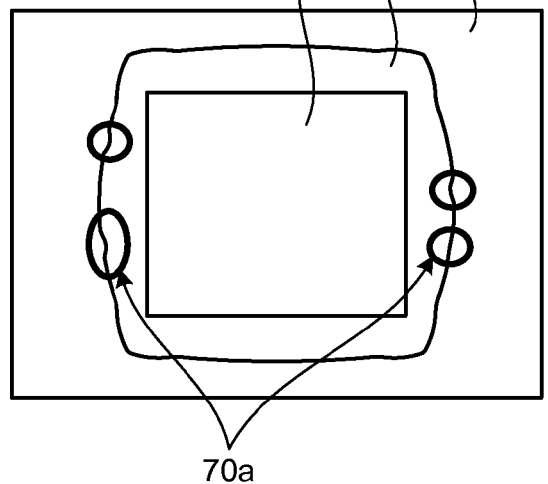

FIGS. 6A to 6C are first schematic diagrams of traces remaining on the used tape and folded lines formed on the product. As illustrated in FIG. 6A, an example of the bonding tool 10 has the chip suction openings 11 but does not have any tape suction opening or any tape suction trench. As illustrated in FIG. 6B, the used tape 30 has a trace of the chip 41 and the folded lines 30a formed due to expansion of the tape. As illustrated in FIG. 6C, the underfill material 70 has the folded lines 70a transferred.

Figure 7A:
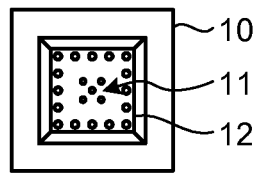
FIGS. 7A to 7C are second schematic diagrams of traces remaining on the used tape and folded lines formed on the product.
Figure 7B:
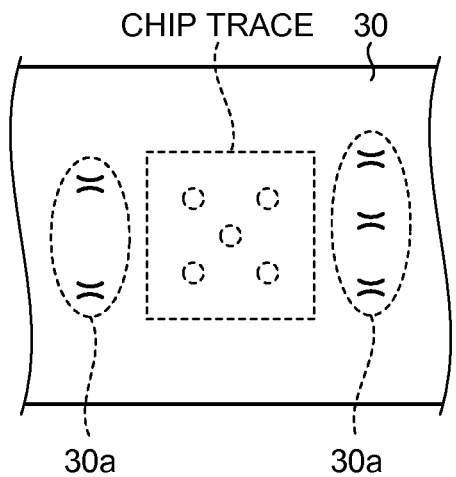
Figure 7C:
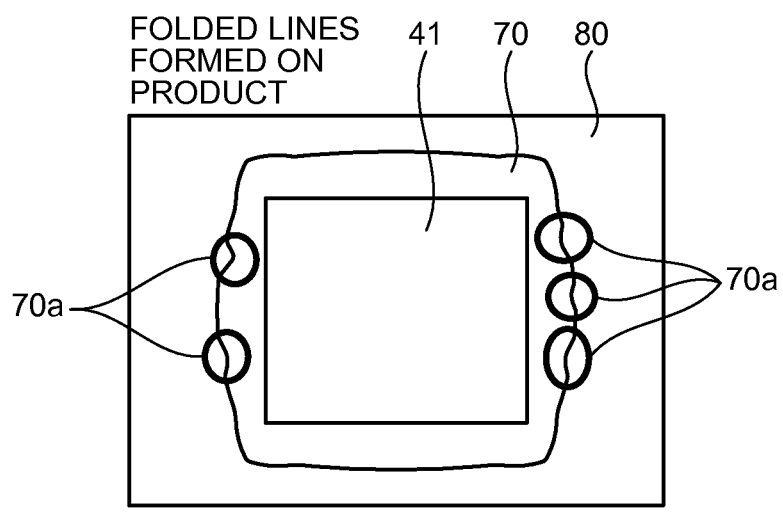

FIGS. 7A to 7C are second schematic diagrams of traces remaining on the used tape and folded lines formed on the product. As illustrated in FIG. 7A, an example of the bonding tool 10 has the chip suction openings 11 and the tape suction openings 12 but does not have any tape suction trench. As illustrated in FIG. 7B, the used tape 30 has the trace of the chip 41 and the folded lines 30a formed due to expansion of the tape. As illustrated in FIG. 7C, the underfill material 70 has the folded lines 70a transferred.

Figure 8A:
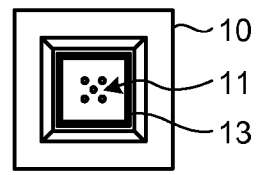
FIGS. 8A to 8C are second schematic diagrams of traces remaining on the used tape and folded lines formed on the product when the disclosed technology is used.
Figure 8B:
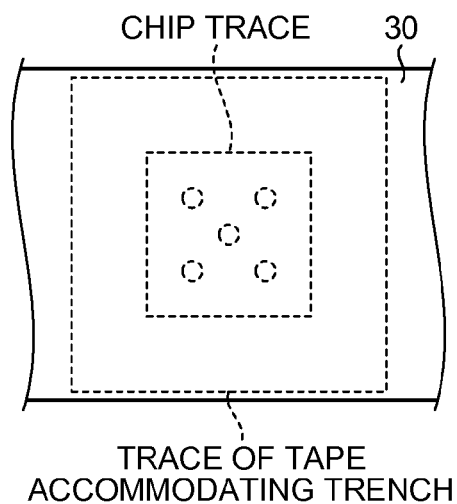
Figure 8C:
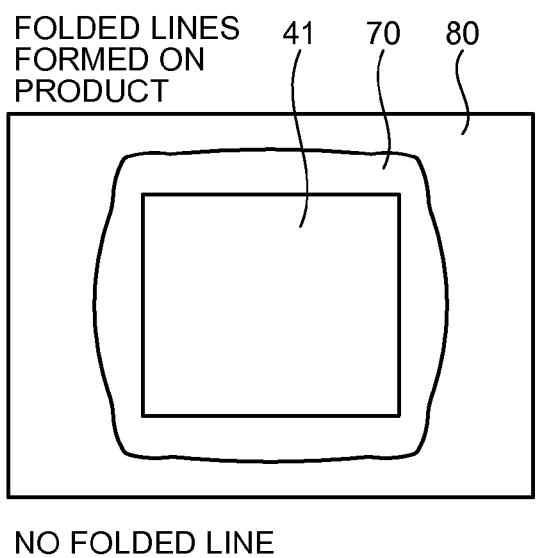

FIGS. 8A to 8C are second schematic diagrams of traces remaining on the used tape and folded lines formed on the product when the disclosed technology is used. In the example illustrated in FIG. 8A, the bonding tool 10 has all of the chip suction openings 11, the tape suction openings 12, and the tape accommodating trench 13. Because the folded lines formed due to expansion of the tape are inserted into the trench 13, as illustrated in FIG. 8B, the used tape 30 has a trace of the chip 41 and a trace of the tape accommodating trench. Because the trace of the tape accommodating trench is outside of the underfill material 70, no folded line is formed on the underfill material 70 as illustrated in FIG. 8C.

Figure 9:
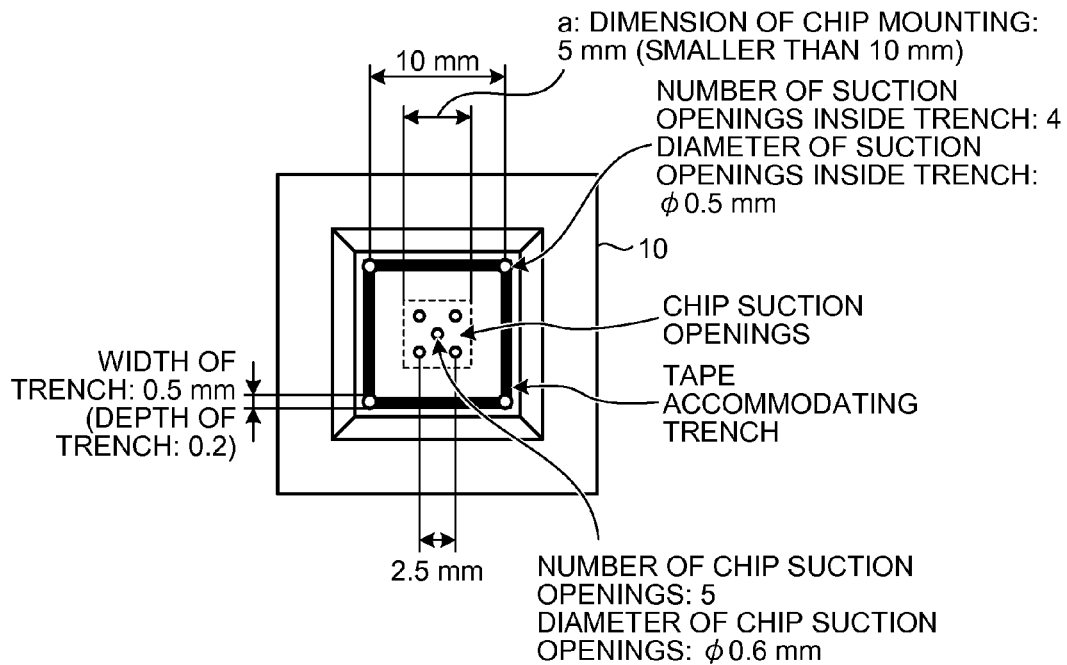
FIG. 9 is a schematic diagram of an example of the chip with its dimensions.

FIG. 9 is a schematic diagram of an example of the chip with its dimensions. As illustrated in FIG. 9, when the chip 41 is mounted, the chip 41 is, for example, a square measuring 5 mm in each side. The side is preferably a value smaller than 10 mm. The chip suction openings 11 are, for example, five and the diameter of each opening is 0.6 mm: four openings are at the four corners of a 2.5 mm square, respectively; one opening is at the center of the square.

The trench 13 extends along, for example, a 10 mm square, surrounding the chip 41 suction points. The dimension of the trench 13 is set to a value larger than the sum of the dimension of the chip 41 and the amount of the protruding underfill material 70. The trench 13 has, for example, 0.5 mm in width and 0.2 mm in depth. The four tape suction openings are at the four corners of the trench 13, respectively. The diameter of each tape suction opening is 0.5 mm. The thickness of the tape is, for example, about 35 μm to about 50 μm; the width of the tape is, for example, about 16 mm. The trench 13 preferably has the width twice as wide as the width of the tape and the depth higher than the thickness of the tape.

Figure 10:
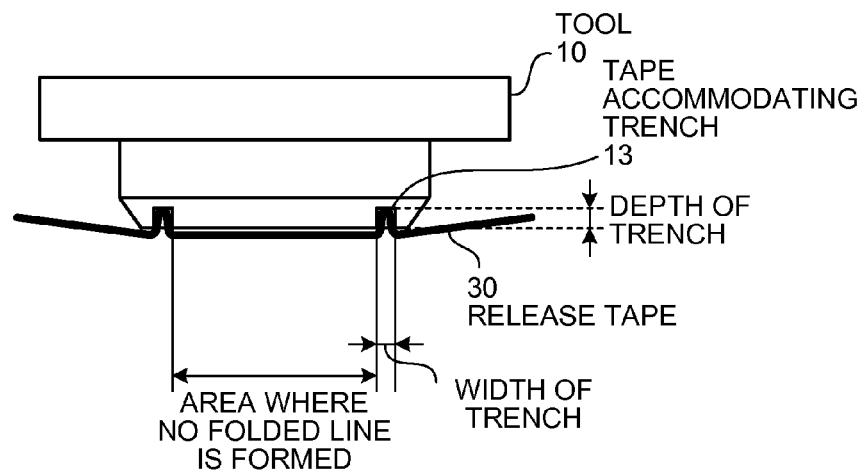
FIG. 10 is a schematic diagram that illustrates how the trench accommodates the tape.
Figure 11A:
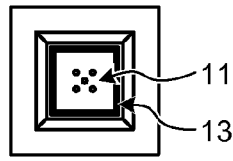
FIGS. 11A to 11F is schematic diagrams that illustrate how to prevent a folded line being formed during a mounting process.
Figure 11B:
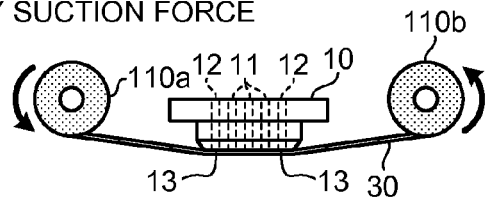
Figure 11C:
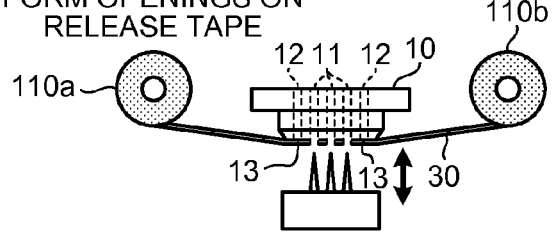
Figure 11D:
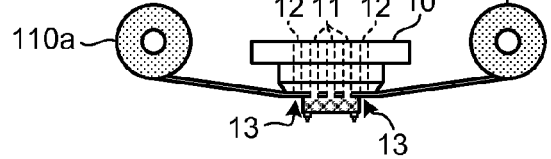
Figure 11E:
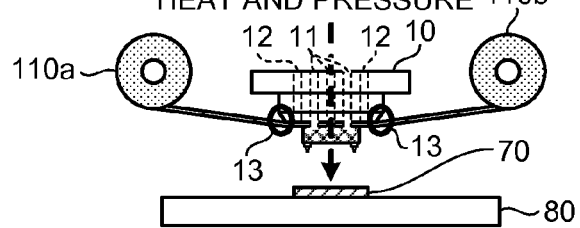
Figure 11F:
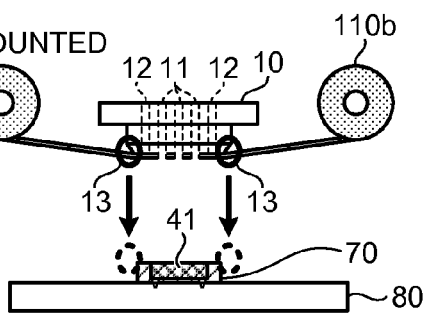

FIG. 10 is a schematic diagram that illustrates how the trench accommodates the tape. As illustrated in FIG. 10, when the release tape 30 is expanded by heat, the expanded part is inserted into the trench 13. With this configuration, the trench 13 has a space inside to accommodate a folded line.

Prevention of a folded line being formed when a chip is mounted is described more with reference to FIGS. 11A to 11F. As illustrated in the plan view of the tool of FIG. 11A, the chip 41 is mounted as a flip chip using the bonding tool 10 that has all of the chip suction openings 11 and the tape accommodating trench 13 as the following five steps:
(11B) Feed the release tape.
(11C) Form openings on the release tape using needles extending from something like a pin-holder.
(11D) Hold the chip 41 by a suction force.
(11E) Apply heat and pressure to the chip 41 and mount the chip 41 onto the substrate.
(11F) The chip is mounted.

When the heat and pressure is applied at 11E, the underfill material 70 is hardened at the same time. Although the release tape is expanded by the heat and folded lines are formed thereon, the trench 13 stops the folded lines extending any more. Therefore, no folded line of the tape is formed within the area inside the trench 13 and no folded line is transferred onto the surface of the underfill material 70.

Figure 12A:
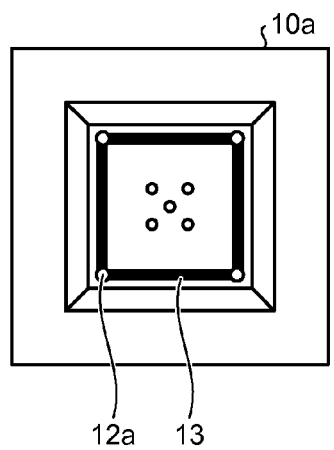
FIGS. 12A to 12C are schematic diagrams of examples of the layout of tape suction openings with respect to the trench.
Figure 12B:
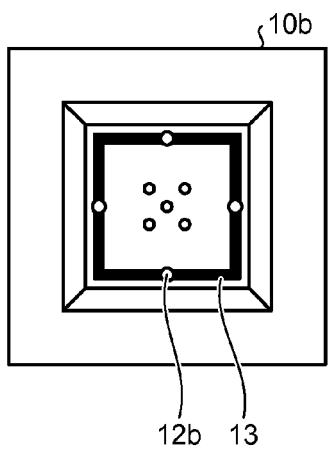
Figure 12C:
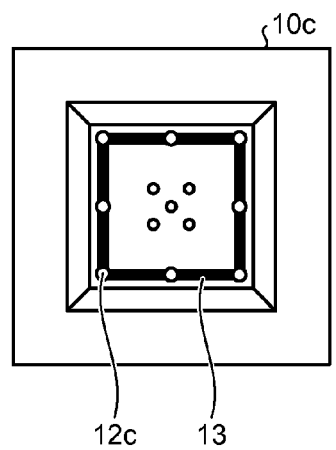

FIGS. 12A to 12C are schematic diagrams of examples of the layout of the tape suction openings with respect to the trench 13. A bonding tool 10a has four tape suction openings 12a at the four corners of the square trench 13, respectively. A bonding tool 10b has four tape suction openings 12b on the four sides of the square trench 13, respectively. A bonding tool 10c has eight tape suction openings 12c: four openings are at the four corners of the square trench 13, respectively and four openings are on the four sides, respectively.

FIGS. 13A to 13D are schematic diagrams of modifications of the trench. In the modification of FIG. 13A, the trench 13 surrounds the chip suction openings 11. In the modification of FIG. 13B, trenches 13a and 13b extend along two lines perpendicular to the longitudinal direction of the release tape 30, parallel to the in-plane direction of the tape.

FIG. 13C is an example of the configuration in which the bonding head is attached with a common exhaust-air path 14 that leads to both the chip suction openings 11 and the tape suction openings 12. With the configuration provided with the common exhaust-air path 14, it is possible to hold the chip 41 and the tape 30 by the same suction force using a single exhaust-air mechanism. FIG. 13D is an example of the configuration in which the trench 13 has no tape suction opening. Even if the tape is not held by a suction force, only if the trench 13 is present, the trench 13 accommodates a heat expanded part of the release tape 30 and stops a folded line extending any more.

FIG. 14 is a flowchart of an electronic packaging method according to the present embodiment. The electronic packaging apparatus according to the present embodiment feeds the release tape 30 (S101), and holds the release tape 30 by a suction force through the tape suction openings 12 (S102). After that, the electronic packaging apparatus forms openings on the release tape 30 (S103), and holds the first electronic component or the chip 41 by a suction force through the electronic-component suction openings 11 (S104).

The electronic packaging apparatus presses the first electronic component or the chip 41 against the underfill material 70 (S105), heats the chip 41 (S106), and then removes the tape (S107).

The electronic packaging apparatus mounts the second electronic component or the chip 42 onto an area including the chip 41 and the underfill material with the adhesive agent (S108), and wires the chip 42 by wire bonding (S109).

The electronic packaging apparatus seals the chip 42, the chip 41, and, in some cases, the substrate 80 by molding (S110), and the process control goes to end.

Although, in the above example, the electronic packaging apparatus performs all of flip-chip mounting of the first electronic component, wire-bonding of the second electronic component, and molding of the first and the second electronic components, it is allowable to assign the above processes to two or more devices. For example, the electronic packaging apparatus can be an electronic packaging apparatus that performs part of the above process including the step of sucking the first electronic component by a suction force and holding it (S104), the step of pressing the first electronic component against the adhesive agent and heating it (S106), and the step of removing the release tape and exposing the surface on which the second electronic component is to be mounted (S107).

As described above, an electronic packaging apparatus according to the present embodiment includes a bonding tool that holds a first electronic component against a tape by a suction force. The bonding tool has suction openings against which the first electronic component is held and, surrounding the suction openings, a trench that accommodates the release tape. The trench extends in an area outside the outline of an adhesive agent that is between the electronic component and the substrate.

With this configuration, because an expanded part of the release tape, expanded due to heat, is inserted into the trench, the disclosed apparatus can prevent a folded line being formed on the upper surface of the underfill material on which the upper chip is mounted.

Moreover, the trench extends in accordance with the shape of the edge surface of the bonding tool, for example, to surround the electronic-component suction openings or along lines parallel to each other. Furthermore, the area on which the second electronic component is mounted is larger than the area on which the first electronic component is mounted. The trench extends in an area outside the mounting position of the second electronic component. With this configuration, any overhang of the second electronic component is supported by the adhesive agent and the supporting surface of the adhesive agent becomes flattened.

Moreover, if tape suction openings are provided inside the trench to hold the release tape by a suction force, they help to hold the release tape. If a common exhaust-air path is provided to emit air through both the electronic-component openings and the tape suction openings, the path helps to simplify the exhaust-air path.

Because the release tape has openings aligned with the electronic-component openings, the bonding tool can hold the first electronic component against the release tape by a suction tape.

Moreover, an electronic packaging method according to the present embodiment is at least part of an electronic packaging method of overlapping a second electronic component with a first electronic component that includes mounting a first electronic component onto a substrate. A bonding tool used in the disclosed method has a trench that surrounds an electronic-component suction opening, extending in an area outside of the outline of an adhesive agent that is between the first electronic component and the substrate. The bonding tool holds the first electronic component by a suction force against a release tape that has an opening facing the electronic-component suction opening. The first electronic component is heated, by being pressed against the adhesive agent, and then the release tape is removed to expose a surface on which the second electronic component is mounted.

With the above method, the first electronic component is mounted with an expanded amount of the release tape, expanded due to heat, being inserted into the trench. This prevents a folded line being formed on the upper surface of the underfill material on which the upper chip is mounted.

According to an embodiment, it is possible to prevent folded lines being formed on the surface of an underfill material.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An electronic packaging apparatus for mounting electronic components onto a substrate, the electronic packaging apparatus comprising:
    a release tape;
    a bonding tool that holds a first electronic component against the release tape; and
    a bonding head to which the bonding tool is attached, wherein the bonding tool comprises:
        a contact surface that is parallel to the substrate and contacts the release tape when the bonding tool holds the first electronic component;
        a first suction opening that is formed on the contact surface to hold the first electronic component by a suction force;
        a trench that is formed within the contact surface by concaving midst of the contact surface, and surrounds the first suction opening; and
        a second suction opening that is formed inside the trench to hold the release tape by a suction force, and
    the bonding head has a common exhaust-air path to emit air through both the first suction opening and the second suction opening.

2. The electronic packaging apparatus according to claim 1, wherein the trench extends in accordance with a shape of the contact surface.

3. The electronic packaging apparatus according to claim 1, wherein the trench is shaped to encompass the first suction opening.

4. The electronic packaging apparatus according to claim 1, wherein the trench includes straight lines parallel to each other.

5. The electronic packaging apparatus according to claim 1, wherein
    a second electronic component is mounted on the first electronic component, in which an area on which the second electronic component is mounted is larger than an area on which the first electronic component is mounted, and
    the trench extends in an area outside of a mounting position of the second electronic component.

6. The electronic packaging apparatus according to claim 1, wherein the trench accommodates an expanded part of the release tape, expanded due to heat.

7. The electronic packaging apparatus according to claim 1, wherein the release tape comprises an opening aligned with the first suction opening.

* * * * *